(12) United States Patent
Sugiyama et al.

(10) Patent No.: US 7,453,703 B2
(45) Date of Patent: Nov. 18, 2008

(54) ELECTRONIC COMPONENT MODULE HAVING ELECTRONIC COMPONENT WITH PIEZOELECTRIC DEVICE

(75) Inventors: Yoshikazu Sugiyama, Kamakura (JP); Taku Takaki, Fujisawa (JP)

(73) Assignee: Renesas Technology Corp., Tokyo (JP)

( * ) Notice: Subject to any disclaimer, the term of this patent is extended or adjusted under 35 U.S.C. 154(b) by 253 days.

(21) Appl. No.: 11/260,485

(22) Filed: Oct. 28, 2005

(65) Prior Publication Data
US 2006/0099390 A1    May 11, 2006

(30) Foreign Application Priority Data
Nov. 8, 2004    (JP) .............................. 2004-323831

(51) Int. Cl.
*H05K 7/00*    (2006.01)
(52) U.S. Cl. .................... 361/760; 361/782; 174/254
(58) Field of Classification Search ................ 438/197; 361/760, 782; 333/189; 310/313 R, 344, 310/340; 174/254
See application file for complete search history.

(56) References Cited

U.S. PATENT DOCUMENTS

| | | | |
|---|---|---|---|
| 6,392,142 B1 * | 5/2002 | Uzuka et al. | 174/541 |
| 7,026,188 B2 * | 4/2006 | Taguchi et al. | 438/108 |
| 7,053,456 B2 * | 5/2006 | Matsuo | 257/415 |
| 2001/0015890 A1 * | 8/2001 | Funahara et al. | 361/761 |
| 2002/0036054 A1 * | 3/2002 | Nakatani et al. | 156/233 |
| 2002/0149298 A1 * | 10/2002 | Furukawa et al. | 310/340 |
| 2002/0159242 A1 * | 10/2002 | Nakatani et al. | 361/760 |
| 2003/0141105 A1 * | 7/2003 | Sugaya et al. | 174/256 |
| 2004/0227431 A1 * | 11/2004 | Mishima | 310/313 R |
| 2005/0073377 A1 * | 4/2005 | Sul et al. | 333/189 |
| 2005/0083663 A1 * | 4/2005 | Inoue | 361/760 |
| 2006/0057793 A1 * | 3/2006 | Hatori et al. | 438/197 |

(Continued)

FOREIGN PATENT DOCUMENTS

JP    2004-095633    3/2004

(Continued)

OTHER PUBLICATIONS

Technical Specification Group GSM/EDGE Radio Access Networks; Radio Transmission and Reception (Release 1999), 3GPP TS 05.05 V8.15.0 (Apr. 2003) of 3GPP (URL:L www.3gpp.org).

(Continued)

*Primary Examiner*—Dean A. Reichard
*Assistant Examiner*—Andargie M Aychillhum
(74) *Attorney, Agent, or Firm*—McDermott Will & Emery LLP

(57) ABSTRACT

The present invention is to provide a small-sized electronic component module in which RF units of a mobile phone for multi-band and multi-system are integrated at low cost. In the RF module, an RF transceiver LSI, a SAW chip, and chip components are mounted on a module board. The SAW chip is mounted on the module board so that a cavity is formed between itself and the module board, and the SAW chip and other components such as the RF transceiver LSI and the chip components are adhered to the module board at their peripheral portions by a sheet-like sealing material, and they are directly covered with the sheet-like sealing material from outside thereof.

3 Claims, 7 Drawing Sheets

U.S. PATENT DOCUMENTS

2006/0076388 A1* 4/2006 Sato .......................... 228/102
2006/0196912 A1* 9/2006 Sato .......................... 228/10

FOREIGN PATENT DOCUMENTS

| JP | 2004-095633 A | 3/2004 |
|---|---|---|
| JP | 2004-215218 | 7/2004 |
| JP | 2004-215218 A | 7/2004 |
| JP | 2004-222244 | 8/2004 |
| JP | 2004-222244 A | 8/2004 |

OTHER PUBLICATIONS

Technical Specification Group Radio Access Networks; UE Radio Transmission and Reception (FDD) (Release 6), 3GPP TS 25.101 V6.5.0 (Sep. 2004) of 3Gpp (URL: www.3gpp.org).

* cited by examiner

ELECTRONIC COMPONENT MODULE HAVING ELECTRONIC COMPONENT WITH PIEZOELECTRIC DEVICE

CROSS-REFERENCE TO RELATED APPLICATION

The present application claims priority from Japanese Patent Application No. JP 2004-323831 filed on Nov. 8, 2004, the content of which is hereby incorporated by reference into this application.

TECHNICAL FIELD OF THE INVENTION

The present invention relates to a composite part (so-called electronic component module) in which a plurality of electronic components are mounted and integrated on the same board. More particularly, it relates to a technology effectively applied to a module which incorporates various kinds of components such as a filter device and an LSI therein.

BACKGROUND OF THE INVENTION

As a mobile phone system, for example, a GSM system which is called "the second generation mobile phone system" is put into practical use. The standard thereof is Digital cellular telecommunications system (Phase 2+); Radio transmission and reception (Release 1999), GSM 05. 05 version 8.15.0 (2003-04) of ESTI (URL: www.etsi.org/getastandard/home.htm).

In this system, mobile phone services started with 900 MHz band, and thereafter, 1800 MHz band and 1900 MHz band became available along with the increase in the number of subscribers. Consequently, the so-called multi-band mobile phone corresponding to a total of 3 bands have been in widespread use.

Thus, along with the increase in the number of frequency bands, the number of RF components such as an RF filter and a low noise amplifier has been increasing. However, since a demand for size and weight reduction to a mobile phone has been increasing, the RF unit must be reduced in size. In addition, the mobile phone must be realized at low cost by suppressing components cost against increase in the number of RF components.

Further, in WCDMA system which is the third generation mobile phone system, services also started with 2.1 GHz band. The standard for the system is Technical Specification Group Radio Access Networks; UE Radio Transmission and Reception (FDD) (Release 6), 3GPP TS 25.101 v6.5.0 (2004-09) of 3GPP (URL: www.3gpp.org/specs/specs.htm).

For the application to the WCDMA system, the mobile phone must be of a dual system having both of an RF transceiver for GSM system and an RF transceiver for WCDMA system, where the number of frequency bands is 4 in total.

In the third generation mobile phone system, functions for still image transmission, moving image transmission, a memory interface and the like are required in the mobile phone, and thus, the number of components such as an image pickup device, a plurality of liquid crystal displays, a moving image coding/decoding IC, an image memory, an IC card slot and the like increases. As a result, the demand for size reduction of the RF transceiver becomes more severe.

For realizing such a multi-band or multi-system mobile phone, the so-called RF module which is a part in which RF units are integrated is used.

A conventional example of such an RF module is described in Japanese Patent Application Laid-open Publication No. 2004-95633 (Patent Document 1), for example, in which a SAW filter (surface acoustic wave filter) used in a mobile phone and an RF LSI are mounted on the same printed circuit board and resin-sealed to form a module. In this conventional example, electrical connection between a SAW terminal and the printed circuit board and electrical connection between the RF LSI and the printed circuit board are made by means of the wire bonding.

A conventional example of the SAW filter is described in Japanese Patent Application Laid-Open Publication No. 2004-215218 (Patent Document 2), which shows a SAW filter with a so-called flip-chip configuration in which electrodes provided on a piezoelectric substrate are directed toward a printed circuit board and then mounted.

This type of filter is also called CSP (chip size package) filter. In the conventional example, since wire bonding is not utilized for the connection between the SAW terminal and the filter printed circuit board, a component area can be close to a SAW chip area, and thus, the size reduction can be achieved.

In the Patent Documents 1 and 2, however, there is not any description about an optimal technology for modularizing the SAW filter of the CSP together with the RF LSI.

As one example of RF filters used in mobile phones, a FBAR (Film Bulk Acoustic Resonator) is described in, for example, Japanese Patent Application Laid-Open Publication No. 2004-222244 (Patent Document 3).

In the Patent Document 3, however, there is not any detailed and specific technology for realizing a module in which the FBAR and the RF LSI are mounted together.

SUMMARY OF THE INVENTION

Incidentally, as a result of the examination for the technologies described in the Patent Documents 1 to 3 by the inventors of the present invention, it has been found that the following structure is obtained from the combination of these technologies. That is, a SAW filter (FBAR) with a flip-chip configuration is formed in advance separately from an RF LSI, and then, the SAW filter (FBAR) with the flip-chip configuration and the RF LSI are mounted on the same printed circuit board and resin-sealed. In this manner, the RF module is completed.

In this structure, however, since it is necessary to form the SAW filter (FBAR) with the flip-chip configuration in advance, the number of steps in the process increases. In addition, since the SAW chip is mounted on the printed circuit board in the flip-chip configuration and then resin-sealed to form the filter, the demand for size reduction and cost reduction is not satisfied sufficiently. Accordingly, a small-sized and inexpensive RF component module has been required in a mobile phone for a multi-band and multi-system.

In view of these circumstances, an object of the present invention is to provide a small-sized and inexpensive electronic component module capable of solving the above-described problems, in which RF units of a mobile phone for multi-band and multi-system are integrated.

The above and other objects and novel characteristics of the present invention will be apparent from the description of this specification and the accompanying drawings.

The typical ones of the inventions disclosed in this application will be briefly described as follows.

An electronic component module according to the present invention comprises: a printed circuit board having printed circuit patterns formed on one surface thereof and external contact terminals formed on the other surface thereof; a plurality of electronic components mounted on the one surface of the printed circuit board; and a sheet-like sealing material covering the electronic components. At least one of the electronic components is mounted on the printed circuit board so that a cavity is formed between itself and the printed circuit board. The electronic component having a cavity formed between itself and the printed circuit board and the plurality of electronic components except for the electronic component having a cavity are adhered to the printed circuit board at peripheral portions thereof by the sheet-like sealing material and are directly covered with the sheet-like sealing material.

Also, an electronic component module according to the present invention comprises: a printed circuit board having printed circuit patterns formed on one surface thereof and external contact terminals formed on the other surface thereof; a plurality of electronic components mounted on the one surface of the printed circuit board; a sheet-like sealing material covering the electronic components; and an exterior resin material for sealing the printed circuit board. At least one of the electronic components is mounted on the printed circuit board so that a cavity is formed between itself and the printed circuit board. The electronic component having a cavity formed between itself and the printed circuit board is adhered to the printed circuit board at a peripheral portion thereof by the sheet-like sealing material and is covered with the sheet-like sealing material. The covered electronic component having a cavity formed between itself and the printed circuit board and the plurality of electronic components except for the covered electronic component are covered with the exterior resin material from outside thereof. Alternatively, instead of the external resin material, an external metal material for covering the printed circuit board is provided and the electronic components are covered with the exterior metal member from outside thereof.

Furthermore, in the electronic component module according to the present invention, the electronic component having a cavity formed between itself and the printed circuit board has metal bumps which electrically connect the electronic component having a cavity formed between itself and the printed circuit board and the printed circuit patterns provided on the printed circuit board. Also, at least one of the electronic components is a flip-chip LSI mounted on the printed circuit board in a face-down manner. A gap between the flip-chip LSI and the printed circuit board is filled with an underfill material. The electronic component having a cavity between itself and the printed circuit board is a surface acoustic wave filter chip, a film bulk acoustic resonator, or an SMR type BAW.

In addition, in the electronic component module according to the present invention, electrical connection between the electronic components and the printed circuit board is made by using adhesive, and when a melting point of the adhesive is represented as T1 (° C.), a melting point of the sheet-like sealing material is represented as T2 (° C.), a melting point of the underfill material is represented as T3 (° C.), and a melting point of the exterior resin material is represented as T4 (° C.), a relationship of T2<T1, T2<T3<T1, or T4<T2<T3<T1 is satisfied.

The effect obtained by the representative one of the inventions disclosed in this application will be briefly described as follows.

According to the present invention, it is possible to realize a small-sized and inexpensive electronic component module in which RF units of a mobile phone for multi-band and multi-system are integrated.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

The present invention is to be applied to an electronic component module. The embodiments of the present invention will be described below with using an RF module as one example.

First Embodiment

An example of an RF module according to a first embodiment of the present invention will be described with reference to FIG. 1 and FIG. 2.

Figure 1:
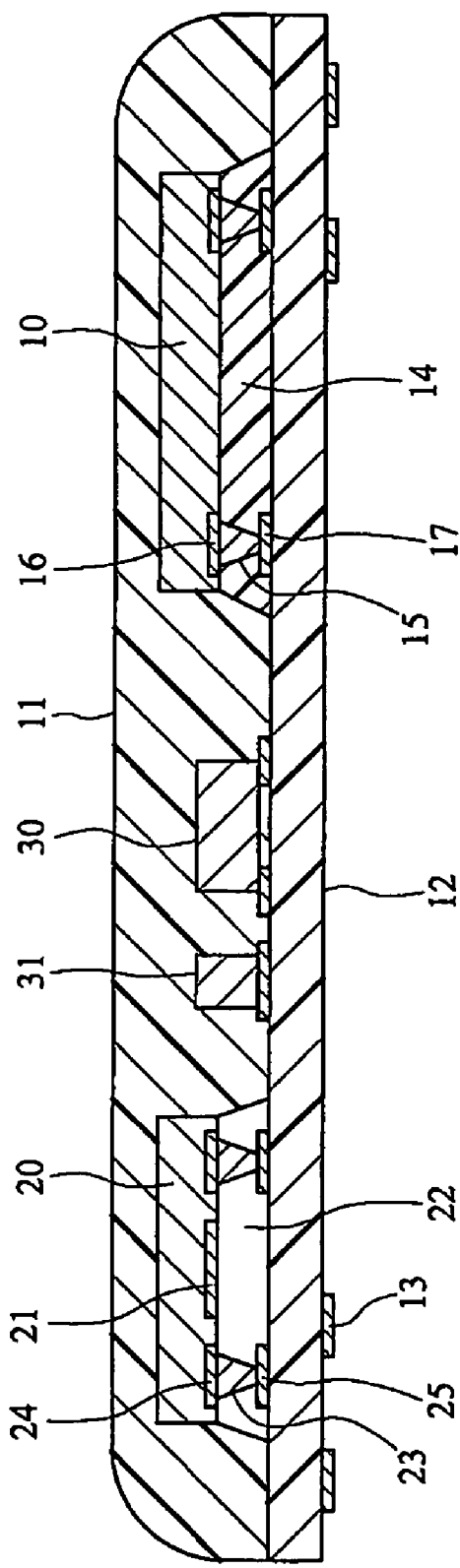
FIG. 1 is a cross-sectional view showing an RF module according to a first embodiment of the present invention.

FIG. 1 is a cross-sectional view of an RF module according to the first embodiment.

The RF module according to the first embodiment is comprised of a module board 12 which is a printed circuit board having printed circuit patterns formed on one surface and external contact terminals formed on the other surface, an RF transceiver LSI 10, a SAW chip 20, and chip components (chip inductor, chip capacitor, chip resistor and the like) 30 and 31 which are electronic components mounted on the one surface of the module board 12, and a sheet-like sealing material 11 which covers the RF transceiver LSI 10, the SAW chip 20, and the chip components 30 and 31.

The module board 12 has module external electrodes 13 as external contact terminals formed on the other surface thereof and LSI patterns 17 and SAW input/output patterns 25 as printed circuit patterns formed on the one surface thereof. The RF transceiver LSI 10, the SAW chip 20, and the chip components 30 and 31 which are mounted on the module board 12 are attached onto the module board 12 at the peripheral portions thereof and are directly covered with the sheet-like sealing material 11.

The RF transceiver LSI 10 is a flip-chip LSI mounted on the module board 12 in a face down manner and has metal bumps 15 electrically connected to the LSI patterns 17 on the module board 12, and the metal bumps 15 are provided on LSI electrodes 16. Also, a gap between the RF transceiver LSI 10 and the module board 12 is filed with an underfill material 14.

The SAW chip 20 has metal bumps 23 electrically connected to SAW input/output patterns 25 on the module board 12, and the bumps 23 are provided on input/output electrodes 24. Also, the SAW chip 20 has a SAW resonator 21, and the SAW chip 20 is mounted so that an oscillating surface of the SAW resonator 21 faces toward the module board 12 and a cavity 22 is formed between the module board 12 and the SAW chip 20.

With such a structure, the RF transceiver LSI 10, the SAW chip 20, and the chip components 30 and 31 are electrically connected mutually through the patterns provided on the module board 12 to form an electronic circuit. This circuit is connected to an external circuit through the module external electrodes 13 and operates as an RF unit of the mobile phone.

The RF transceiver LSI 10 is soldered to the LSI patterns 17 by using the metal bumps 15 made from solder (melting point: T1° C.) as a connecting material. At this time, the chip components 30 and 31 are also soldered simultaneously.

On the other hand, the SAW chip 20 is thermally adhered to the SAW input/output patterns 25 when the metal bumps 23 are gold bumps. When the metal bumps 23 are solder bumps, the SAW chip 20 is soldered simultaneously with the soldering of the RF transceiver LSI 10.

Thereafter, a gap between the RF transceiver LSI 10 and the module board 12 is filled with the underfill material 14. As the underfill material 14, liquid-type thermosetting epoxy resin impregnated with silica as filler is used. The underfill material 14 is cured when heated up to a thermosetting temperature of T3° C. At this time, resin sealing of the RF transceiver LSI 10 which is flip-chip mounted (that is, the LSI is mounted to the board in a face-down manner) is completed.

Next, for the hermetic sealing of the SAW chip 20, the sheet-like sealing material 11 is placed on the module board 12 from above and is brought in close contact therewith by heating. The sheet-like sealing material 11 is a sheet made of thermoplastic resin (melting point: T2° C.) such as polyethylene or polypropylene, and the cavity 22 is formed by optimizing a film thickness or a viscosity of the sealing material.

The sealing by heating the sheet-like sealing material 11 can be performed for the whole substrate including a plurality of connected module boards 12. In this case, after the fixation, the whole substrate is cut into respective module boards with a dicer or the like.

Here, the cavity 22 will be described. This type of cavity 22 is required in all of a SAW, a BAR (Bulk Acoustic Resonator), an FBAR which is a type of the BAR, and a SMR (Solid Mounted Resonator) type BAR, which utilize a principle that electrical signals are converted to mechanical oscillations by a piezoelectric device.

This is because the SAW requires gas as medium through which converted acoustic waves propagate, and the FBAR and SMR type BAR require a free space for allowing oscillation of a piezoelectric element.

The RF module can be formed in the manner described above. In this case, it is necessary for the respective heating temperatures to satisfy the following Expression (1).

$$T2 < T3 < T1 \quad \text{Expression (1)}$$

Next, a main part of the mobile phone using the RF module according to this embodiment will be described with reference to a circuit block diagram shown in FIG. 2.

The main part of the mobile phone using the RF module according to this embodiment is comprised of the above-described RF module 60, a front end module 61, a communication processing unit 62 for performing modulation/demodulation of a base band signal and coding/decoding thereof, an antenna 63, and others.

The RF module 60 is comprised of the RF transceiver LSI 10 for performing transmission/reception for GSM system, a reception SAW filter (SAW chip) 20 for E-GSM band (900 MHz band), a reception SAW filter 64 for DCS band (1800 MHz band), a reception SAW filter 65 for PCS band (1900 MHz band), matching circuits 69 between the SAW filters and a low noise amplifier incorporated in the RF transceiver LSI 10, an RF transceiver LSI 74 for performing transmission and reception for WCDMA system, a reception SAW filter 72 for WCDMA band (2.1 GHz band, also called UMTS band), a matching circuit 73 between the SAW filter and a low noise amplifier incorporated in the RF transceiver LSI 74, and others.

The front end module 61 is comprised of a low pass filter 70 which allows passage of a GSM system signal, a high pass filter 71 which allows passage of the WCDMA band, a GSM transmission and reception switch 67 for performing the switching between transmission signal and reception signal for GSM system, a GSM transmission low pass filter (which may be a band pass filter) 68 which allows passage of a transmission band for GSM system, a high output transmission amplifier 66 for GSM system, a matching circuit 75 between the GSM transmission low pass filter 68 and the high output transmission amplifier 66, a WCDMA transmission low pass filter (which may be a band pass filter) 76 which allows passage of a transmission band for WCDMA, a high output transmission amplifier 77 for WCDMA system, a matching circuit 78 between the WCDMA transmission low pass filter 76 and the high output transmission amplifier 77, and others.

The mobile phone for the third generation mobile phone system is required to accommodate the two transmission and reception systems and the four frequency bands as described above. FIG. 2 illustrates the configuration from the antenna 63 to the communication processing unit 62. In addition to this, electronic components such as a microprocessor, a memory such as a RAM or a ROM, a liquid crystal display, a liquid crystal driver IC, an image pickup device, a moving image coding and decoding IC, an image RAM, and an IC card slot, and others are used to form the mobile phone.

Figure 2:
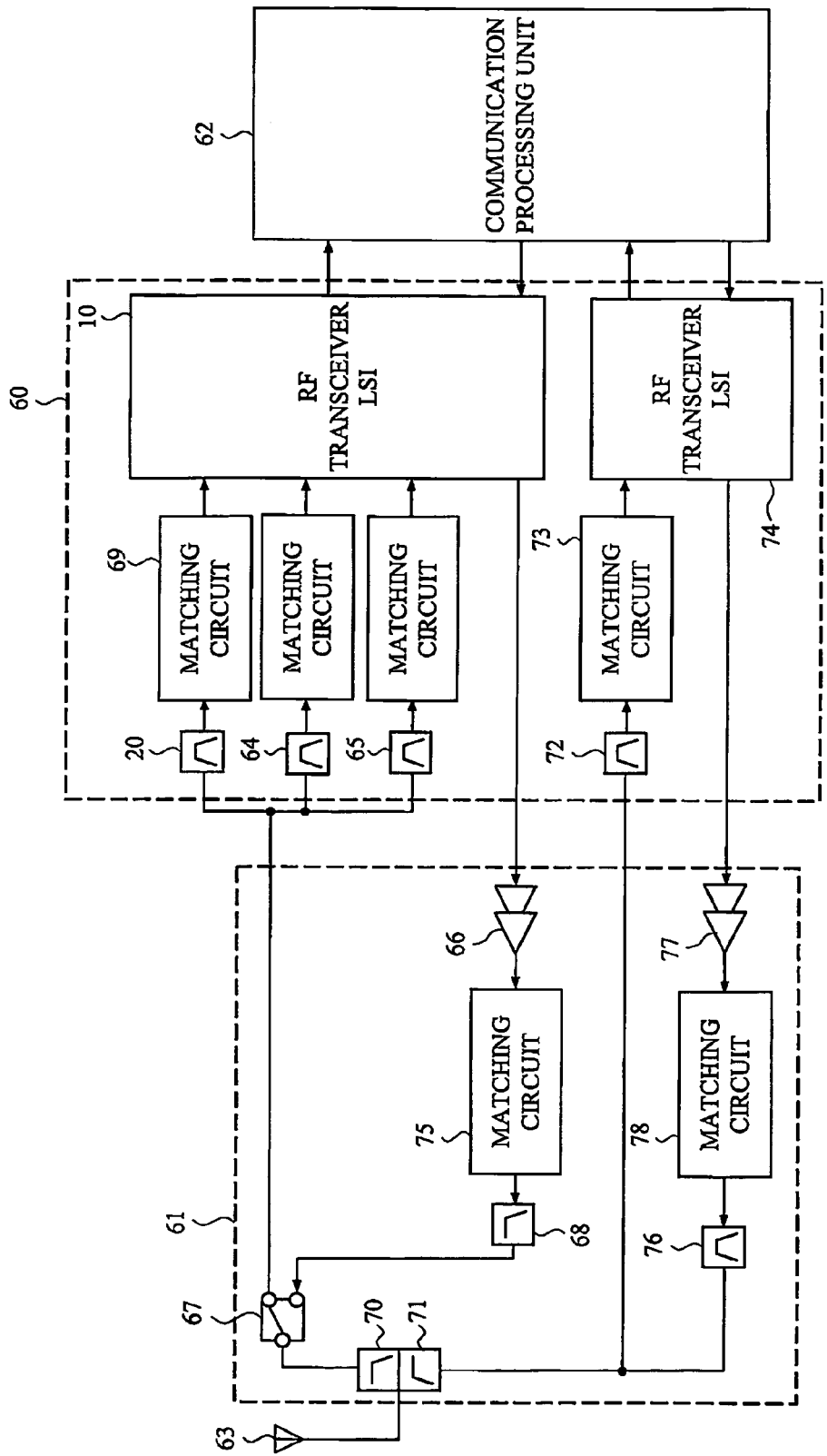
FIG. 2 is a circuit block diagram showing a main part of a mobile phone using the an RF module according to the first embodiment of the present invention.

With the configuration as shown in FIG. 2, the RF unit of the mobile phone can be realized from the two parts of the RF module 60 and the front end module 61.

Therefore, according to the first embodiment, since the RF transceiver LSI 10, the SAW chip 20, the chip components 30 and 31 can be mounted on the module board 12 in the same step of the manufacturing process, the number of manufacturing steps can be reduced and the whole size of the mobile phone including a height of the RF module can be reduced. As a result, a small-sized and inexpensive RF module of a mobile phone for multi-band and multi-system can be realized.

Second Embodiment

An example of an RF module according to a second embodiment of the invention will be described with reference to FIG. 3.

Figure 3:
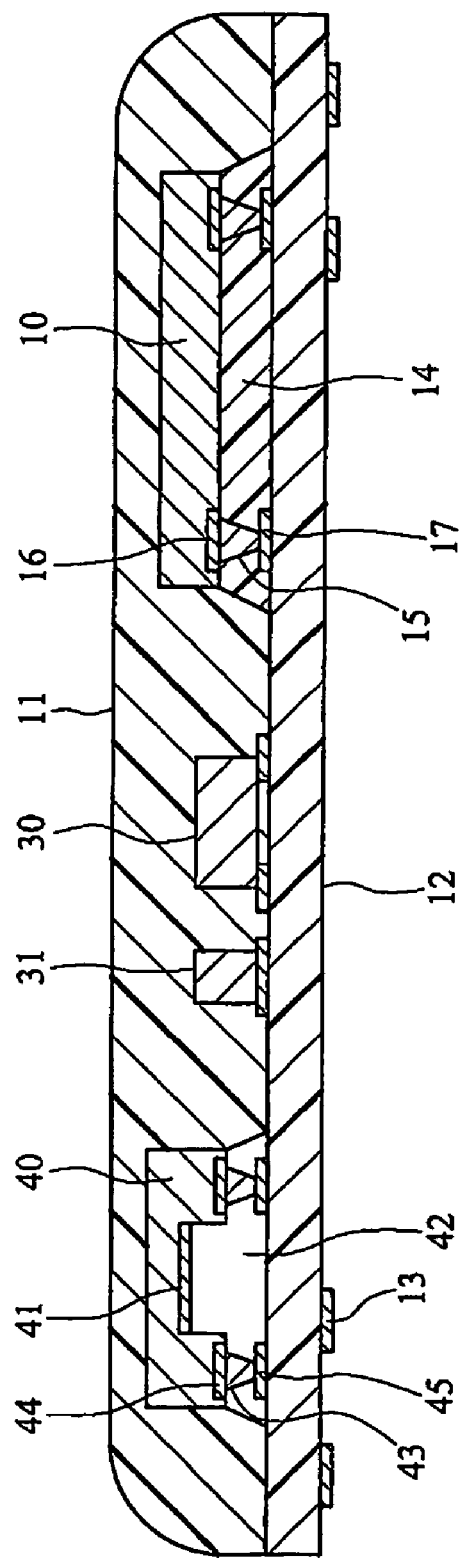
FIG. 3 is a cross-sectional view showing an RF module according to a second embodiment of the present invention.

FIG. 3 is a cross-sectional view of an RF module according to this embodiment.

In the RF module according to the second embodiment, the difference from that of the first embodiment lies in that a reference numeral 40 denotes a FBAR chip which is another example functioning as an electronic component mounted so as to form a cavity between itself and a module board, 41 denotes a film bulk acoustic resonator, 42 denotes a cavity, 43 denotes metal bumps, 44 denotes input/output electrodes provided on the FBAR chip, and 45 denotes FBAR input/output patterns on a surface layer of the module board.

In the RF module according to this embodiment, the RF transceiver LSI 10, the FBAR chip 40 and others are soldered on the module board 12, and the space below the RF transceiver LSI 10 is filled with the underfill material 14 in the same manner as the first embodiment. Thereafter, the sheet-like sealing material 11 is placed on the module board, and it is heated and brought in close contact with the module board, while the cavity 42 is formed under the film bulk acoustic resonator 41. In this manner, the RF module is sealed.

Here, the example where the filter device is the FBAR has been illustrated. However, the present invention can be similarly applied to the case where the filter device is a SMR type BAR.

Therefore, according to the second embodiment, in the RF module in which the RF transceiver LSI 10, the FBAR chip 40, and the chip components 30 and 31 are mounted on the module board 12, a small-sized and inexpensive RF module of a mobile phone for multi-band and multi-system can be realized like in the first embodiment.

Third Embodiment

An example of an RF module according to a third embodiment of the invention will be described with reference to FIG. 4.

Figure 4:
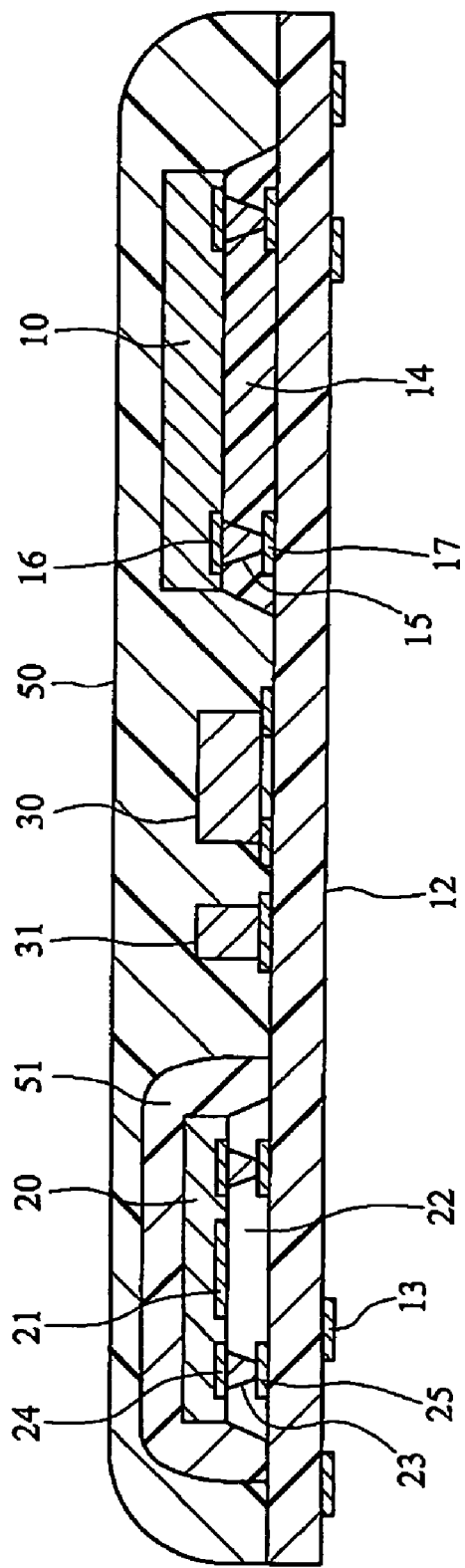
FIG. 4 is a cross-sectional view showing an RF module according to a third embodiment of the present invention.

FIG. 4 is a cross-sectional view of an RF module according to this embodiment.

In the RF module according to the third embodiment, the difference from that of the first embodiment lies in that a reference numeral 50 denotes an exterior sealing material serving as exterior resin material for sealing a module board and 51 denotes a heat sealing material serving as a sheet-like sealing material covering the electronic components.

In the RF module according to this embodiment, the RF transceiver LSI 10, the FBAR chip 40 and others are soldered on the module board 12, and the space below the RF transceiver LSI 10 is filled with the underfill material 14 in the same manner as the first embodiment. Thereafter, a heat sealing material 51 which covers only the SAW chip 20 is placed on the SAW chip 20 and it is heated and brought in close contact with the SAW chip 20 while forming the cavity 22 (melting point: T4° C.).

In this manner, sealing of the SAW chip 20 is completed. Then, exterior sealing for the whole RF module is performed by applying an exterior sealing material 50. As the exterior sealing material 50, inexpensive thermosetting epoxy resin which is commonly used as a sealing material can be selected.

In this case, similar to the first embodiment, the respective heating temperatures satisfy the following condition of Expression (2).

$$T4 < T2 < T3 < T1 \quad \text{Expression (2)}$$

Therefore, according to the third embodiment, in the RF module in which the RF transceiver LSI 10, the SAW chip 20, and the chip components 30 and 31 are mounted on the module board 12, only the SAW chip 20 is covered with the heat sealing material 51, and the whole module is sealed with the exterior sealing material 50, a small-sized and inexpensive RF module of a mobile phone for multi-band and multi-system can be realized like in the first embodiment.

Fourth Embodiment

An example of an RF module according to a fourth embodiment of the present invention will be described with reference to FIG. 5.

Figure 5:
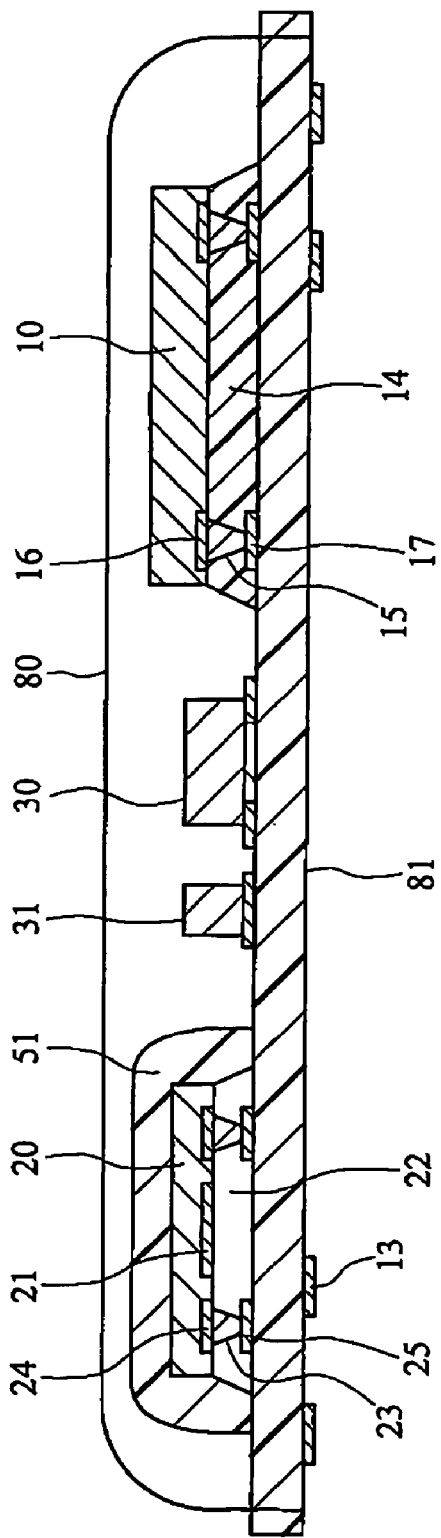
FIG. 5 is a cross-sectional view showing an RF module according to a fourth embodiment of the present invention.

FIG. 5 is a cross-sectional view of an RF module according to the fourth embodiment.

In the RF module according to the fourth embodiment, a difference from that of the third embodiment lies in that a reference numeral 80 denotes a metal case serving as an exterior metal member covering an upper surface of the RF module, and 81 denotes a module board provided with notches (slits) for fixing the metal case 80.

In the RF module according to this embodiment, the heat sealing material 51 for covering only the SAW chip 20 is placed on the SAW chip 20 and it is heated and brought in close contact with the SAW chip 20 while forming a cavity 22 in the same manner as the third embodiment. The module board 81 has the notches at four corners thereof, and plate-like protrusions are formed on the metal case 80 at the positions corresponding to the notches of the module board 81. The metal case 80 is fixed on the module board 81 by placing metal case 80 on the module board 81 and fitting the plate-like protrusions into the notches of the module board 81.

Alternatively, copper foil patterns are provided at four corners of the module board 81 and portions of the metal case 80 corresponding to the copper foil patterns are soldered and fixed to the copper foil patterns.

Therefore, according to this embodiment, in the RF module in which the RF transceiver LSI 10, the SAW chip 20, and the chip components 30 and 31 are mounted on the module board 12, only the SAW chip 20 is covered with the heat sealing material 51, and an upper surface of the module is covered with the metal case 80, a small-sized and inexpensive RF module of a mobile phone for the multi-band and multi-system can be realized like in the third embodiment. In addition, with such a configuration, since the electronic components in the RF module are electromagnetically shielded from outside, anti electromagnetic wave interference property can be improved.

Fifth Embodiment

An example of an RF module according to a fifth embodiment of the invention will be described with reference to FIG. 6.

Figure 6:
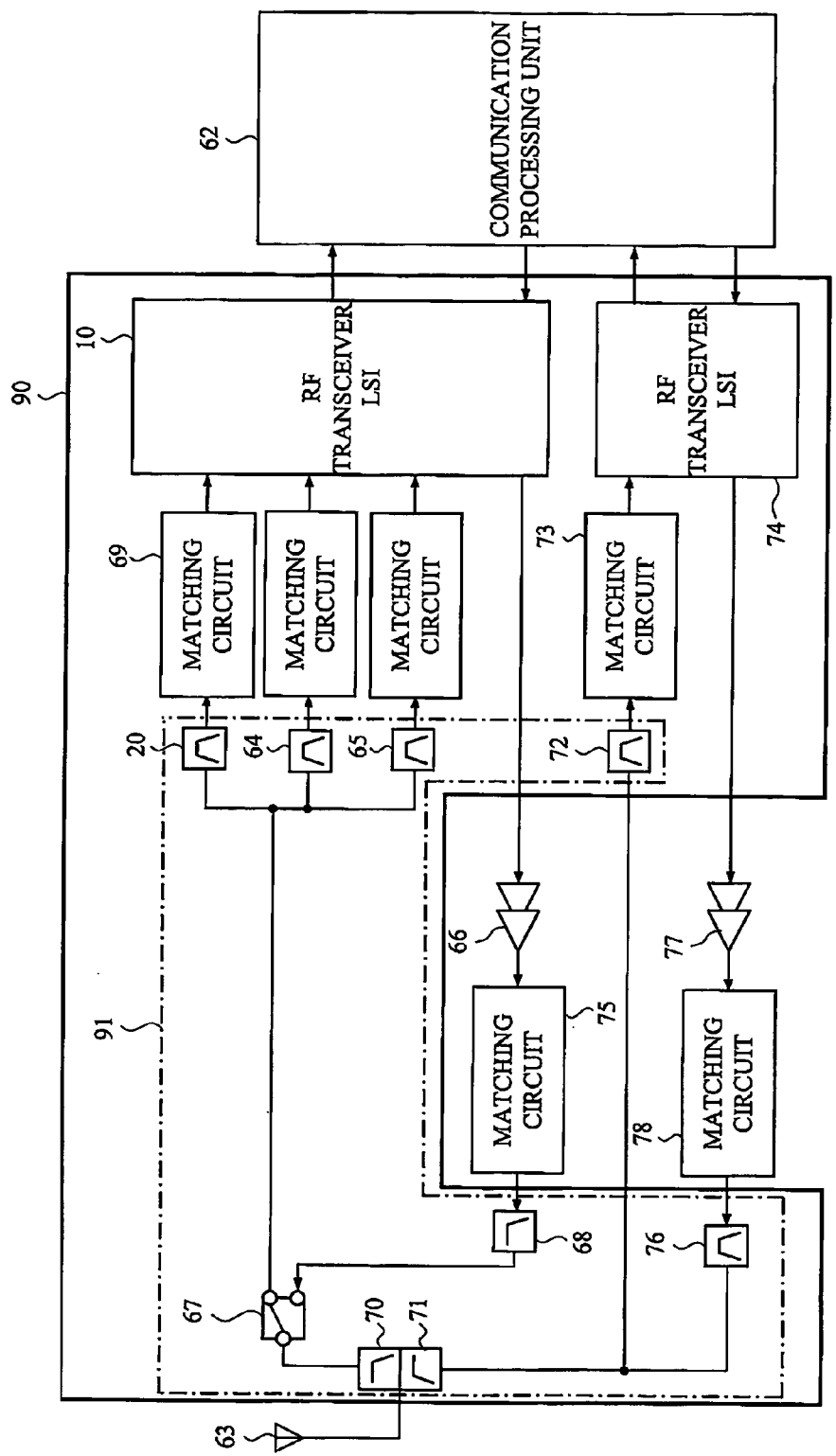
FIG. 6 is a circuit block diagram showing an RF module according to a fifth embodiment of the present invention.

FIG. 6 is a circuit block diagram of an RF module 90 according to the fifth embodiment. The RF module 90 is comprised of an antenna switch 91, an RF transceiver LSI 10, an RF transceiver LSI 74, matching circuits 69, and a matching circuit 73.

The antenna switch 91 is a composite electronic part which includes two systems for transmission and reception such as a reception system from a low pass filter 70 to a reception SAW filter 65 and a transmission system from a GSM transmission low pass filter 68 to the low pass filter 70.

With the configuration shown in FIG. 6, the RF unit of the mobile phone can be realized by using the RF module 90, the high output transmission amplifier 66 for GSM system, the matching circuit 75, the high output reception amplifier 77 for WCDMA system, and the matching circuit 78.

Therefore, according to this embodiment, since the RF transceiver LSI 10, the antenna switch 91, and the chip components 30 and 31 are mounted on the module board 12 in the same step of the manufacturing process, the number of manufacturing steps can be reduced and the whole size of the mobile phone including a height of the RF module can be reduced. As a result, a small-sized and inexpensive RF module of a mobile phone for multi-band and multi-system can be realized.

Sixth Embodiment

An example of an RF module according to a sixth embodiment of the invention will be described with reference to FIG. 7.

Figure 7:
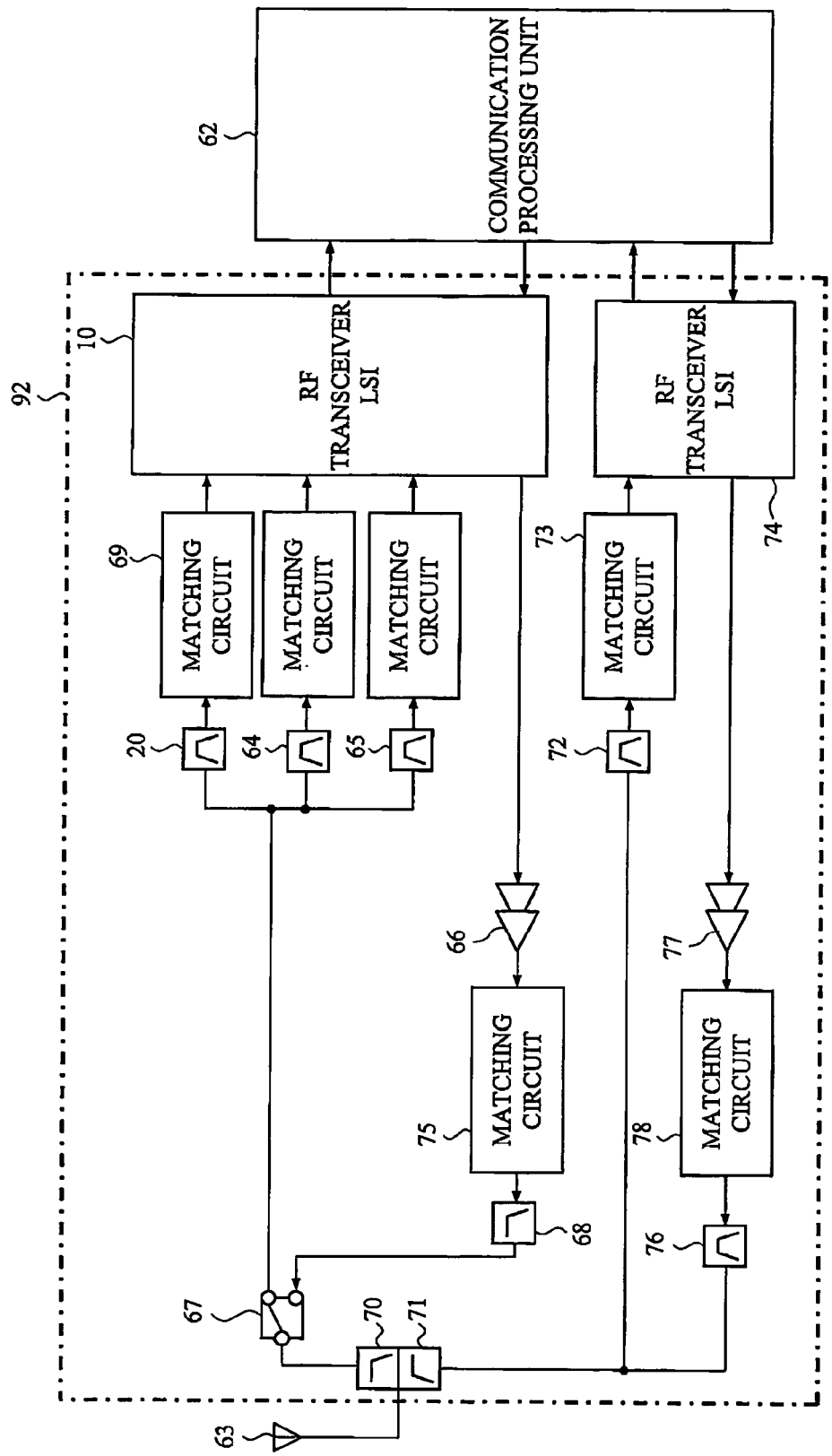
FIG. 7 is a circuit block diagram showing an RF module according to a sixth embodiment of the present invention.

FIG. 7 is a block diagram of an RF module 92 according to the sixth embodiment. The RF module 92 is comprised of a GSM transceiver system including a reception system from a lower pass filter 70 to a reception SAW filter 65 and a transmission system from a high output transmission amplifier 66 of GSM system to a low pass filter 70, an RF transceiver LSI 10, a WCDMA transceiver system including a reception system from a high pass filter 71 to a reception SAW filter 72 and a transmission system from a high output transmission amplifier 77 of WCDMA system to a high pass filter 71, an RF transceiver LSI 74 and others.

With the configuration shown in FIG. 7, the RF unit of the mobile phone can be realized by using only the RF module 92.

Therefore, according to this embodiment, since the RF transceiver LSI 10, the SAW chip 20, the high output transmission amplifier 66 for GSM system, the high output transmission amplifier 77 for WCDMA system, and the chip components 30 and 31 are mounted on the module board 12 in the same step of the manufacturing process, the number of manufacturing steps can be reduced and the whole size of the mobile phone including a height of the RF module can be reduced. As a result, a small-sized and inexpensive RF module of a mobile phone for multi-band and multi-system can be realized.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to an electronic component module such as an RF module, which is used in a radio-communication device including a mobile phone.

What is claimed is:

1. A printed circuit board having printed circuit patterns formed on one surface thereof and external contact terminals formed on the other surface thereof;

a surface acoustic wave chip mounted on the one surface of said printed circuit board such that a cavity with gas required by the surface acoustic wave chip is formed between itself and the printed circuit board a flip-chip large scale integration mounted on the one surface of said printed circuit board in a face-down manner, and a sheet-like sealing material covering said surface acoustic wave chip and said large scale integration wherein a gap between said flip-chip large scale integration and said printed circuit board is filled with an underfill material wherein said cavity is hermetically sealed by bringing said sheet-like sealing material in close contact with the printed circuit board by heating; and wherein said hermetically sealed surface acoustic wave chip and said flip-chip large scale integration filled with said underfill material adhered to said printed circuit board at peripheral portions thereof by said sheet-like sealing material and are directly covered with said sheet-like sealing material.

2. Wherein said surface acoustic wave chip has metal bumps which electrically connect said surface acoustic wave chip device and the printed circuit patterns provided on said printed circuit board.

3. Wherein electrical connection between said electronic components including said surface acoustic wave chip and said flip-chip large scale integration and said printed circuit board is made by using adhesive, and when a melting point of said adhesive is represented as $T1°$ C., a melting point of said sheet-like sealing material is represented as $T2°$ C., and a melting point of said underfill material is represented as $T3°$ C., a relationship of T2 T3 T1 is satisfied.

* * * * *